United States Patent
Peng et al.

[11] Patent Number: 6,121,545
[45] Date of Patent: *Sep. 19, 2000

[54] LOW CLOSURE FORCE EMI SHIELDING SPACER GASKET

[75] Inventors: Shu Hui Peng, Malden; Daniel S. Ventura, Newbury, both of Mass.

[73] Assignee: Parker-Hannifin Corporation, Cleveland, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 09/042,135

[22] Filed: Mar. 13, 1998

Related U.S. Application Data

[60] Provisional application No. 60/052,362, Jul. 11, 1997.

[51] Int. Cl.⁷ ..................................................... H05K 9/00
[52] U.S. Cl. .................................. 174/35 GC; 277/639; 277/650; 277/920; 277/649; 277/612
[58] Field of Search ........................... 174/35 GC, 35 R, 174/35 MS, 52.1; 277/630, 639, 650, 920, 651, 649, 612

[56] References Cited

U.S. PATENT DOCUMENTS

| | | | |
|---|---|---|---|
| Re. 34,393 | 9/1993 | McIllwraith | 312/265.4 |
| 4,652,695 | 3/1987 | Busby | 174/35 GC |
| 5,020,866 | 6/1991 | McIlwraith | 312/265.4 |
| 5,147,121 | 9/1992 | McIlwraith | 312/296 |
| 5,566,055 | 10/1996 | Salvi, Jr. | 361/816 |
| 5,731,541 | 3/1998 | Bernd et al. | 174/35 GC |

FOREIGN PATENT DOCUMENTS 0 654 962 A1  11/1994  European Pat. Off. .

OTHER PUBLICATIONS

Article entitled "Processing of Single and Multi–component Adhesives and Sealants" by Paul Invanfi, published 1986, together with English translation.

Paper entitled Recent Developments in Elastomeric.

*Primary Examiner*—William A. Cuchlinski, Jr.
*Assistant Examiner*—Ronnie Mancho
*Attorney, Agent, or Firm*—John A. Molnar, Jr.

[57] ABSTRACT

An EMI shielding spacer gasket assembly for interposition under a predetermined compressive load within an electronics enclosure between a first surface and an oppositely-disposed second surface of the enclosure. The assembly includes a frame member and an electrically conductive, elastomeric member extending along at least a portion of the perimeter of the frame member as retained on a corresponding peripheral edge surface thereof. The elastomeric member has an outboard side which is compressible axially under the compressive load for providing an electrically conductive pathway between the surfaces of the enclosure. In an uncompressed orientation, the outboard side of the elastomeric member exhibits elongate upper and lower bearing portions which are disposed at a spaced-apart radial distance from the frame member to define a corresponding bending moment arm. Each of the bearing portions is angularly deflectable relative to the moment arm to effect the compression of the elastomeric member under a relatively low compressive load.

39 Claims, 8 Drawing Sheets

LOW CLOSURE FORCE EMI SHIELDING SPACER GASKET

RELATED CASES

The present application claims priority to U.S. Provisional Application Ser. No. 60/052,362, filed Jul. 11, 1997.

BACKGROUND OF THE INVENTION

The present invention relates broadly to electromagnetic interference (EMI) shielding/grounding gaskets or seals, and particularly to a low closure force EMI shielding spacer gasket which is particularly adapted for use within small electronics enclosures such as cellular phone handsets and other handheld electronic devices.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having a less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

EMI shielding gaskets typically are constructed as a resilient core element having gap-filling capabilities which is either filled, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, silicone rubber, or fluorosilicone rubber.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, plated glass, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression, transfer, or injection molding of an uncured or thermoplastic elastomer into the desired configuration.

More recently, a form-in-place (FIP) process has been proposed for the manufacture of EMI shielding gaskets. As is described in commonly-assigned, co-pending application U.S. Ser. No. 08/377,412 filed Jan. 24, 1995, and in Canadian Patent Application 2,125,742, such process involves the application of a bead of a viscous, curable, electrically-conductive composition in a fluent state to a surface of a substrate such as a housing or other enclosure. The composition then is cured-in-place via the application of heat or with atmospheric moisture to form an electrically-conductive, elastomeric EMI shielding gasket in situ on the surface of the substrate. By forming and curing the gasket in place directly on the surface of the substrate, the need for separate forming and installation steps is obviated. Moreover, the gasket may be adhered directly to the surface of the substrate to further obviate the need for a separate adhesive component or other means of attachment of the gasket to the substrate. In contrast to more conventional die cutting or molding processes, the flashless FIP process reduces waste generation, and additionally is less labor intensive in that the need for hand assembly of complex gasket shapes or the mounting of the gasket into place is obviated. The process, which is marketed commercially under the name Cho-Form® by the Chomerics Division of Parker-Hannifin Corp., Woburn, Mass., further is amenable to an automated or roboticly-controlled operation, and may be employed to fabricate complex gasket geometries under atmospheric pressure and without the use of a mold.

Another recent EMI shielding solution for electronics enclosures is further described in commonly-assigned U.S.

Pat. No. 5,566,055 and is marketed commercially under the name Cho-Shield® by the Parker Chomerics Division. Such solution involves the over-molding of the housing or cover with an conductive elastomer. The elastomer is integrally molded in a relatively thin layer across the inside surface of the housing or cover, and in a relatively thicker layer along the interface locations thereof providing both a gasket-like response for environmentally sealing the cover to the housing and electrical continuity for the EMI shielding of the enclosure. The elastomer additionally may be molded onto interior partitions of the cover or housing to provide electromagnetically-isolated compartments between potentially interfering circuitry components.

Figure 1:
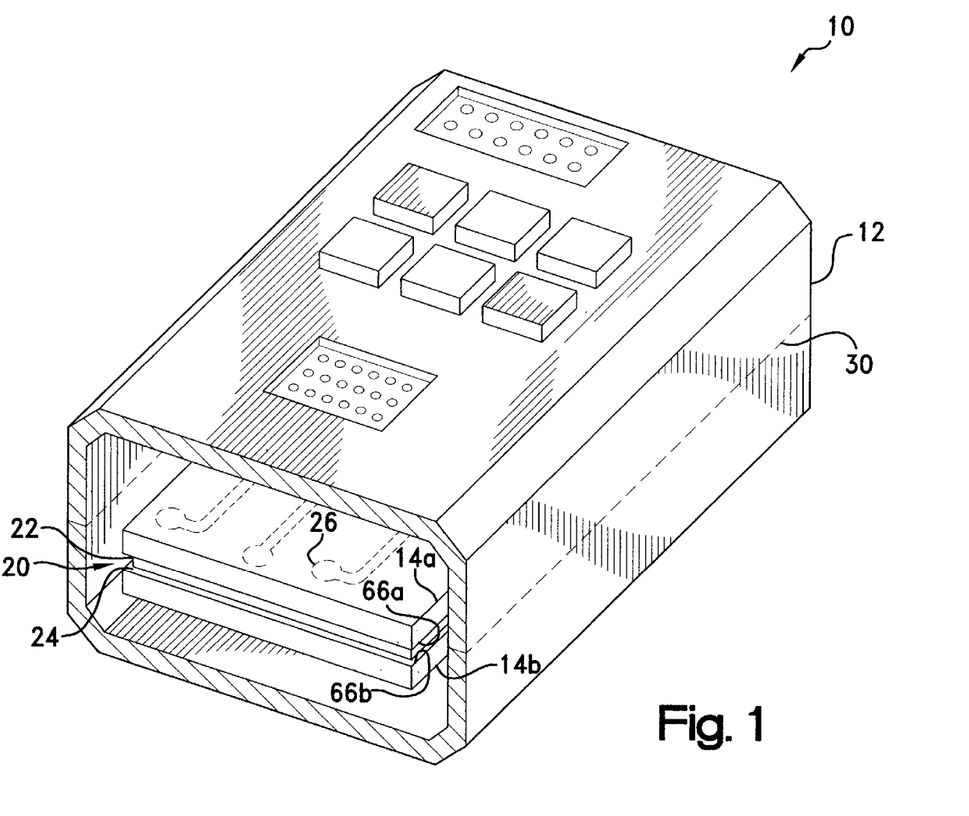
FIG. 1 is a perspective end view, partially in cross-section, of a handheld electronic communication device representative of a typical application for the spacer gaskets herein involved.

Yet another solution for shielding electronics enclosures, and particularly the smaller enclosures typical of cellular phone handsets and other handheld electronic devices, concerns the incorporation of a thin plastic retainer or frame as a supporting member of the gasket. The electrically conductive elastomer may be molded or, as is described in EP Patent No. 654,962, formed-in-place or otherwise attached to the inner or inner peripheral edge surfaces and/or to the upper or lower face surfaces of the frame. So constructed, the gasket and frame assembly may be integrated within the electronic device to provide a low impedance pathway between, for example, peripheral ground traces on a printed circuit board (PCB) of the device, and other components thereof such as the conductive coating of a plastic housing, another PCB, or a keypad assembly. Uses for the spacer gaskets of the type herein include EMI shielding applications within digital cellular, handyphone, and personal communications services (PCS) handsets, PC cards (PCMCIA cards), global positioning systems (GPS), radio receivers, and other handheld devices such as personal digital assistants (PDAs). Other uses include as replacements for metal EMI shielding "fences" on PCBs in wireless telecommunication devices. An example one of these applications is shown in FIG. 1 wherein a handset is shown at 10 as including a housing or other enclosure, 12, within which is received a pair of PCBs, 14*a–b*. A spacer gasket, referenced generally at 20, which includes a frame, 22, and an electrically-conductive, elastomeric member, 24, is inserted between PCBs 14 for providing, for example, a conductive pathway between one or more of the corresponding ground traces, one of which is designated at 26, of the boards.

Requirements for typical spacer applications generally specify a low impedance, low profile connection which is deflectable under relatively low closure force loads, e.g., about 1.0–8.0 lbs (2–16 kg) per inch of gasket length. Other requirements include low cost and a design which is adapted for automated assembly and which provides an EMI shielding effectiveness both for the proper operation of the device and for compliance, in the United States, with commercial Federal Communication Commission (FCC) EMC regulations. Spacer gaskets of the type herein involved are further described by Peng, S. H., and Tzeng, S. V., in "Recent Developments is Elastomeric EMI Shielding Gasket Design," and in the Parker Chomerics Technical Publication, "EMI Shielding and Grounding Spacer Gasket" (1996).

Figures 2A, 2B:
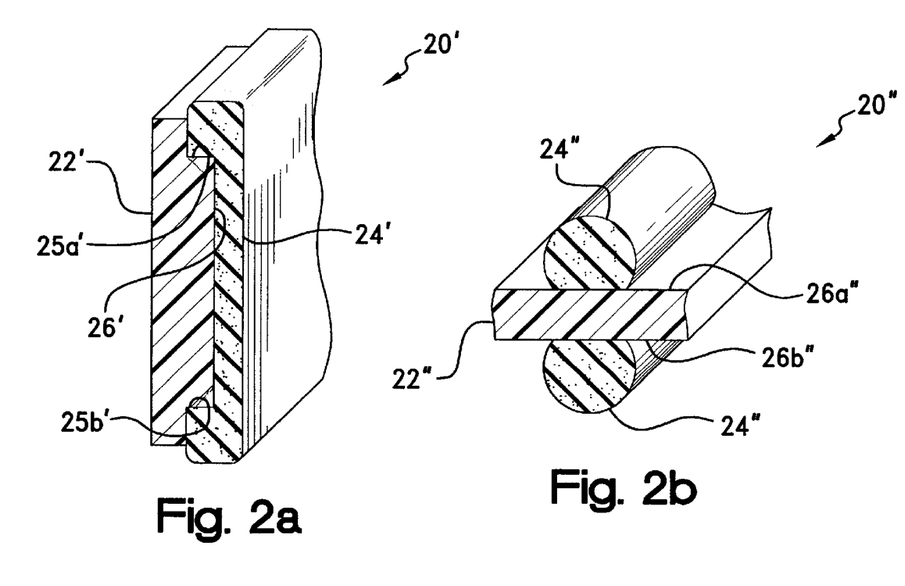
FIG. 2A is a cross-sectional, perspective end view of a spacer gasket embodiment representative of the prior art.
FIG. 2B is a cross-sectional, perspective end view of another spacer gasket embodiment representative of the prior art.

Heretofore, conventional EMI shielding spacer gasket cross-sections involved the generally flat or hemispherical cross-sectional profiles which are illustrated in cross-section in FIGS. 2A and 2B. In those figures, spacer gasket 20 of FIG. 1 reappears, respectively, as the prior art gaskets 20' and 20", with the prime and double prime designations being used throughout FIGS. 2A and 2B to distinguish the elements thereof, and with common reference to those elements being made in unprimed fashion. As is shown at 20 in FIGS. 2A and 2B, each of the conventional spacer gaskets includes a relatively thin retainer frame 22 which may be molded of a plastic material such as ABS, polycarbonate, nylon, polyester, polyetherimide, a liquid crystal polymer (LCP), or the like. A length of electrically-conductive elastomeric member 24, which usually is formulated as a silver or silver-plated-filled silicone or fluorosilicone, is bonded or otherwise retained along a peripheral edge or other surface, 26, of the frame 22. As in FIG. 2A, elastomeric member 24' may be injection or compression molded to the lands, 25*a–b'*, of stepped frame edge surface 26'. Alternatively, as in FIG. 2B, elastomeric member 24" may be formed-in-place along the planar upper and lower face surfaces, designated at 26*a"* and 26*b"*, of the frame 22".

When inserted between a pair of faying surfaces of a housing or circuit board assembly such as PCBs 14 of FIG. 1, the elastomeric member 24 of gasket 20 exhibits a characteristic deformation responsive to a closure or other deflection force transferred from the housing or PCB surfaces. Generally, a minimum deflection, typically of about 10%, is specified to ensure that the member sufficiently conforms to the mating housing or board surfaces to develop an electrically conductive pathway therebetween. It has been observed that for certain applications, however, that the closure or other deflection force required to effect the specified minimum deflection of the spacer gasket profiles heretofore known in the art is higher than can be accommodated by the particular housing or board assembly design. Thus, it will be appreciated that further improvements in the design of spacer gaskets profiles would be well-received by the electronics industry. As the sizes of handheld electronic devices such as cellular phone handsets has continued to shrink, especially desired therefore would be a low closure force gasket profile which is especially adapted for use in the smaller electronics enclosures which are rapidly becoming the industry standard.

BROAD STATEMENT OF THE INVENTION

The present invention is directed to a low closure force EMI shielding spacer gasket profile especially adapted for use in smaller electronic enclosure packages. In having an elastic member featuring a moment arm portion which is angularly deflectable in an inward or outward direction relative to the retainer member responsive to a compressively-applied load, the profile of the present invention is seen to exhibit lower closure force requirements than the spacer gasket profiles heretofore known in the art. That is, for a specified joint configuration, the spacer gasket profile of the present. invention exhibits a greater deflection under a given compressive load than conventional profiles.

In a preferred embodiment, the elastomeric member, as having a cross-sectional profile provided in accordance with the precepts of the present invention, is molded or otherwise supported on a stepped peripheral edge surface of the retainer frame. In further accordance with the precepts of the invention, the lands of such surface are angled or otherwise abridged to increase the thickness of the elastomeric member and to thereby effect a further reduction of the required closure force. When supported on the inward edge surface of the retainer, the moment arm portion of the elastomeric member additionally may be angled to develop an outward force component advantageously directing the deflection of the moment arm portion toward the retainer and away from the interior of the enclosure wherein the member might otherwise interfere with the proper operation of the circuit boards of the subject device.

It therefore is a feature of a preferred embodiment of the present invention to provide an EMI shielding spacer gasket assembly for interposition under a predetermined compressive load within an electronics enclosure between a first surface and an oppositely-disposed second surface of the enclosure. The assembly includes a frame member and an electrically conductive, elastomeric member extending along at least a portion of the perimeter of the frame member as retained on a corresponding peripheral edge surface thereof The elastomeric member has an outboard side which is compressible axially under the compressive load for providing an electrically conductive pathway between the surfaces of the enclosure. In an uncompressed orientation, the outboard side of the elastomeric member exhibits elongate upper and lower bearing portions which are disposed a spaced-apart radial distance from the frame member to define a corresponding bending moment, arm. Each of the bearing portions is angularly deflectable relative to the moment arm to effect the compression of the elastomeric member under a relatively low compressive load.

It is a further feature of the preferred embodiment of the present invention to provide an EMI shielded assembly within an electronics enclosure. The assembly includes a first surface of the enclosure, an oppositely-disposed second surface of the enclosure, and a spacer gasket interposed under a predetermined compressive load between the first and said second enclosure surfaces. The spacer gasket includes a frame member and an electrically conductive, elastomeric member extending along at least a portion of the perimeter of the frame member as retained on a corresponding peripheral edge surface thereof. The elastomeric member has an outboard side which is compressed axially under the compressive load for providing an electrically conductive pathway between the surfaces of the enclosure. In an uncompressed orientation, the outboard side of the elastomeric member exhibits elongate upper and lower bearing portions which are disposed a spaced-apart radial distance from the frame member to define a corresponding bending moment arm. Each of the bearing portions is angularly deflected relative to the moment arm to effect the compression of the elastomeric member under a relatively low compressive load.

It is a yet further feature of the preferred embodiment of the present invention to provide an EMI shielding spacer gasket assembly for interposition under a predetermined compressive load within an electronics enclosure between a first surface and an oppositely-disposed second surface of the enclosure. The assembly includes a frame member and an electrically conductive, elastomeric member extending along at least a portion of the perimeter of the frame member as retained on a corresponding peripheral edge surface thereof. The elastomeric member has outboard and inboard sides including top and bottom surfaces. At least one of the top or bottom surfaces is formed to include a plurality of projections disposed intermediate the inboard and outboard sides thereof as spaced-apart along at least a portion of said frame member. Each of the projections is configured to extend beyond the corresponding upper or lower surface of the frame member for contact with a corresponding one of the surfaces of the enclosure. The projections are compressible axially under the compressive load for providing an electrically conductive pathway between the surfaces of the enclosure.

Advantages of the preferred embodiments of the present invention include an improved spacer gasket profile for low closure force applications such as may be found in small, handheld electronic devices. Additional advantages are a gasket profile which provides for a stable interface contact with the housing or circuit board components of the enclosure for more assured electrical continuity and, in turn, more reliable EMI shielding effectiveness. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" and "axial" referring, respectively, to directions perpendicular and parallel to the longitudinal central axis of the referenced element. Terminology of similar import other than the words specifically mentioned above likewise is to be considered as being used for purposes of convenience rather than in any limiting sense.

For the purposes of the discourse to follow, the precepts of the inventive spacer gasket herein involved are described in connection with its application within the enclosure of a handheld electronics device such as enclosure 12 of the device 10 shown in FIG. 1. For example, and as is illustrated for gasket 20, the spacer gasket of the present invention may be inserted within the enclosure between a pair of PCBs such as boards 14a–b. Alternatively, the gasket may be interposed between an electronics housing and an associated cover, or between a parting line of the housing, such as the line 30 shown in phantom in FIG. 1. It will be appreciated, moreover, that aspects of the present invention may find utility in other EMI shielding applications. Use within those such other applications therefore should be considered to be expressly within the scope of the present invention.

Figures 3, 4:
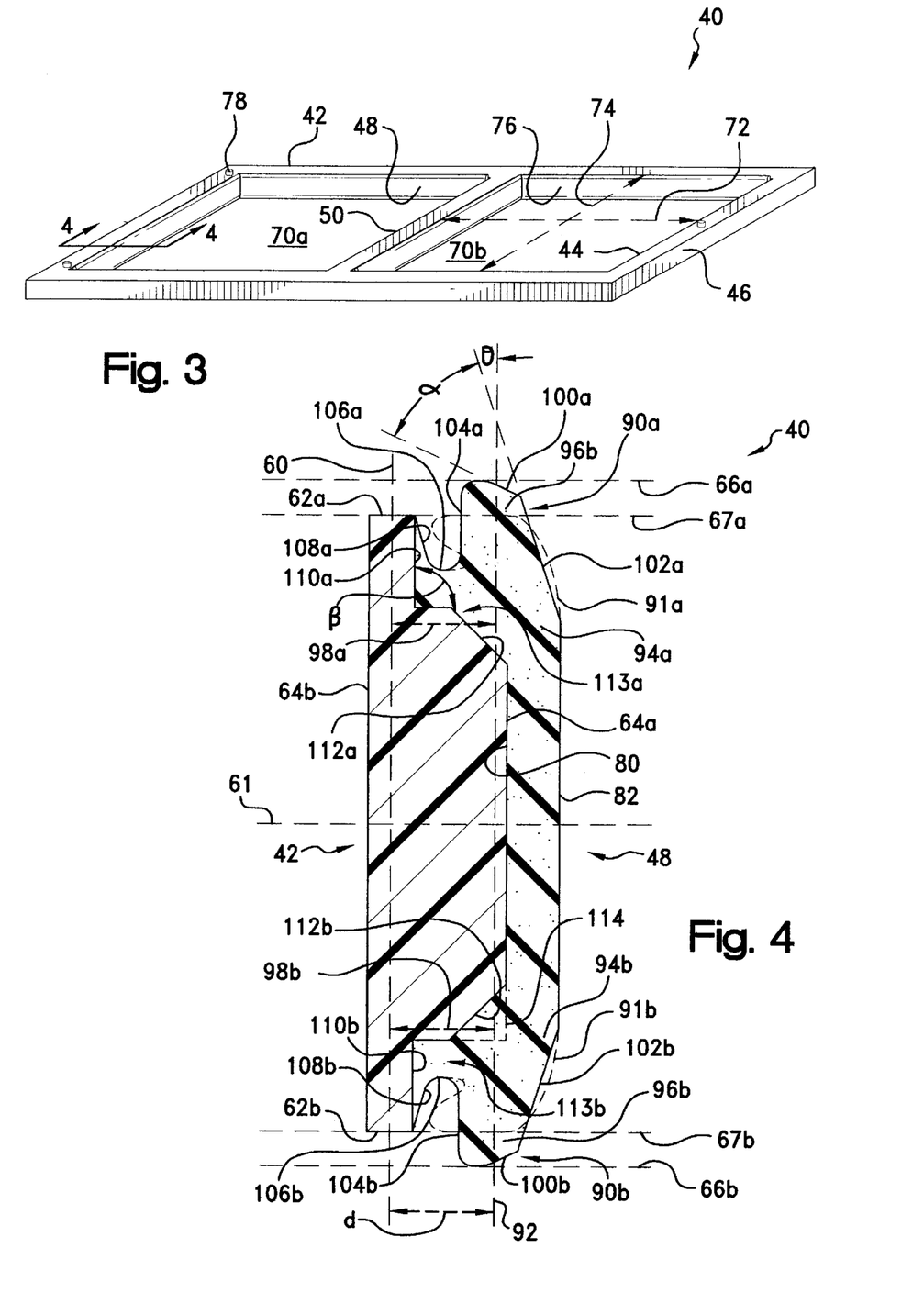
FIG. 3 is a perspective view of one embodiment of an EMI shielding spacer gasket in accordance with the present invention.
FIG. 4 is a cross-sectional view of the spacer gasket of FIG. 3 taken through the plane represented by line 4—4 of FIG. 3.

Referring then to the figures wherein corresponding reference characters are used to designate corresponding elements throughout the several views, a spacer gasket 20 of FIG. 1 reappears at 40 in FIG. 3 as configured according to the present invention. In basic construction, assembly 40 includes a frame, 42, having an inner and outer perimeter, 44 and 46, and an electrically conductive, elastomeric member, 48, which extends along at least a portion of one or both the inner perimeter 44 or outer perimeter 46 of the frame. Preferably, frame 42, which may include one or more integral mullions or dividers, 50, is conventionally injection or otherwise molded of an electrically-nonconductive, thermoplastic or other polymeric material such as a poly(ether ether ketone), polyimide, high molecular weight polyethylene, polypropylene, polyetherimide, polybutylene terephthalate, nylon, fluoropolymer, polysulfone, polyester, ABS, acetal homo or copolymer, and particularly a liquid crystal polymer such as Vectra® A130 (Hoechst Celanese, Engr. Plastics Div., Chatham, N.J.).

As may be seen with additional reference to the enlarged cross-sectional view of FIG. 4, the frame, which is reference generally at 42, is provided as having a cross-sectional profile of a closed geometric area which extends along an axially-directed first central axis, 60, and along a radially-directed second central axis, 61. Such profile is bounded by an upper an lower face surface, 62a–b, and by an inner and outer peripheral edge surface, 64a–b, which define the inner and outer perimeters 44 and 46 (FIG. 3) of frame 42. Within an enclosure such as enclosure 12 of FIG. 1, assembly 40 is oriented such that first axis 60 is disposed generally perpendicular to the surfaces to be gasketed, such as the opposing surfaces 66a–b of boards 14a–b (FIG. 1) which surfaces 66 are juxtaposed in phantom in FIG. 4, with second axis 61 being shown in FIG. 4 to be disposed generally parallel to those surfaces. Further within enclosure 12, each of the frame face surfaces 62 is disposed in confronting opposition with a corresponding one of the surfaces 66 of the enclosure.

Returning to FIG. 3, it may be seen that as extending along its inner and outer perimeter 44 and 46, frame 42 defines within the electronics enclosure one or more enclosed regions, such as regions 70a–b, each having, as is referenced for region 70b, a lengthwise extent, 72, and a widthwise extent, 74. As is shown at 76 for region 70b, at least a portion of the inner or outer margins of enclosed regions 70 is defined by elastomeric member 48. For assuring the positive position of these regions within the electronics enclosure, frame 42 may be molded or otherwise provided as having one or more positioning pins such as the pin which is referenced at 78 in FIG. 3.

Looking again to FIG. 4, the elastomeric member, which is referenced generally at 48, is shown as having an inboard side, 80, which is molded over or otherwise retained on a corresponding peripheral edge surface 64 of frame 42, and an outboard side, 82 which is compressible axially under a predetermined compressive load intermediate surfaces 66 for providing an electrically conductive pathway therebetween. In this regard, elastomeric member 48 preferably is overmolded to cover edge surface 64a by injection or compression as formed of an electrically-conductive, elastomeric silicone or fluorosilicone composition. As used herein, the term "elastomeric" is ascribed its conventional meaning of exhibiting rubber-like properties of compliancy, resiliency or compression deflection, low compression set, flexibility, and an ability to recover after deformation, i.e., stress relaxation. As with silicone elastomers in general, the preferred silicone material exhibits properties such as thermal and oxidation resistance over a wide temperature range, and well as resistance to many chemicals and to weather effects, which makes it especially suited for use as a thermal interface material. The material further exhibits excellent electrical properties including resistance to corona breakdown over a wide range of temperatures and humidity.

In a preferred embodiment of the invention, the elastomeric composition is rendered electrically conductive via the loading of a continuous phase of a silicone or fluorosilicone binder with an electrically-conductive filler. Suitable electrically-conductive fillers include nickel and nickel-plated substrates such as graphite, noble metal-based fillers, and particularly silver-based fillers such as: pure silver; silver-plated noble metals such as silver-plated gold; silver-plated non-noble metals such as silver-plated copper, nickel, aluminum, and tin; and silver-plated glass, ceramics, plastics, and mica; and mixtures thereof. The shape of the filler is not considered critical to the present invention, and may include any shape that is conventionally involved in the manufacture or formulation of conductive materials of the type herein involved including solid spheres, hollow microspheres, flakes, platelets, fibers, rods, or irregularly-shaped particles Similarly, the particle size of the filler is not considered critical, but generally will be in the range of from about 0.250–250 μm, with a range of from about 0.250–75 μm being preferred.

The filler is loaded in the composition in a proportion sufficient to provide the level of electrical conductivity and EMI shielding effectiveness in the cured gasket which is desired for the intended application. For most applications, an EMI shielding effectiveness of at least 10 dB, and preferably at least 20 dB, and most preferably at least 100 dB or higher, over a frequency range of from about 10 MHz to 12 GHz is considered acceptable. Such effectiveness translates to a filler proportion which generally is between about 10–80% by volume, based on the total volume of the reaction system, and preferably is between about 20–70% by volume. As is known, however, the ultimate shielding effectiveness of the cured gasket will vary based on the amount of electrically-conductive material in the filler and the imposed load or deflection, typically between about 10–50%, of the gasket.

A particularly preferred composition for forming elastomeric member 48 is a silver-plated-glass-filled silicone formulation which is marketed by the Chomerics Division of Parker-Hannifin Corp., Woburn, Mass. as Cho-Seal® 1310 conductive elastomer. Such material has a low volume resistivity and a good resistance to compression set over a wide temperature range which makes it well suited for grounding applications in which a flexible electrical contact is needed. Characteristic physical and electrical properties of this material are shown in Table 1.

TABLE 1

Physical Properties of a Representative Ag/Glass-Filled Silicone Electrically-Conductive Elastomer (Cho-Seal ® 1310)

| 1310 | Test Method | Cho-SeaI ® |
|---|---|---|
| Volume Resistivity (Ω-cm, max.) | CEPS-002[1] | 0.01 |
| Hardness (Shore A) | ASTM-D2240 | 70 ± 10 |
| Specific Gravity (typical) | ASTM-D2240 | 1.7–1.9 |
| Tensile Strength (psi (MPa), min.) | ASTM-D2240 | 200 (1.38) |
| Elongation (%, min.) | ASTM-D2240 | 100 |
| Compression Set, 70 hrs @ 100° C. (%, max.) | ASTM-D2240 (Method B) | 35 |
| Shielding Effectiveness (dB) | CHO-TM-TP08[1] | |
| 100 MHz (E-Field) | | 100 |
| 100 MHZ (E-Field) | | 100 |
| 2 GHz (Plane Wave) | | 90 |
| 10 GHz (Plane Wave) | | 80 |
| Heat Aging (Ω-cm, max.) | CEPS-0021 | 0.01 |

[1]Chomerics Test Methodology

Continuing with FIG. 4, it may be seen that in the uncompressed orientation shown, the outboard side 82 of elastomeric member 48 exhibits elongate upper and lower bearing portions, 90*a–b*. Bearing portions referenced generally at 90 each extend in cross-section along a common longitudinal axis, 92, from an internal proximal end, 94*a–b*, to an external distal end, 96*a–b*. As is shown, each distal end 96 terminates axially beyond a corresponding one of the frame face surfaces 62 for contact with a corresponding one of the surfaces 66 of the enclosure.

In accordance with the precepts of the present invention, bearing portion longitudinal axis 92 is disposed a spaced-apart radial distance, referenced at "d", from the first central axis 60 of frame member 42. Thereby, a corresponding bending moment arm, referenced at 98*a–b*, is defined relative to which each of the bearing portions 90 is angularly deflectable responsive to an axially-applied compressive load. The bending of bearing portions 90 is shown in phantom at 91*a–b* as responsive to a compressive load developed by the axial displacement of enclosure surfaces 66*a–b* to the locations shown at 67*a–b*. It has been observed, rather unexpectedly, that the provision of such bending mechanism lowers the load required to effect a given deflection of the gasket by about 50% or more, as compared to the deflection attainable through the compression of the gasket alone. That is, for a given compressive load, the axial deflection of the gasket according to the present invention is more than twice the deflection of a gasket of conventional design which does not exhibit the described bending moment. For example, under a compressive load of about 1.0–2.0 lb/in in a typical application, the gasket of the invention may be deflected by at least about 0.0080–0.016 inch per inch of gasket length. Accordingly, it will be appreciated that the gasket of the present invention is especially adapted for use in EMI shielding applications, such as in communication handsets and other handheld devices, which specify a low closure force shielding solution. Advantageously, however, a uniform surface contact interface can be maintained for good electrical continuity.

In the particularly preferred embodiment shown in FIG. 4, each of bearing portions 90 includes an outboard camming surface, a corresponding pair of which are shown for each bearing portion 90 at 100*a–b* and 102*a–b*. As is referenced at "θ" and "α" for surfaces 100*a* and 102*a*, each of theses surfaces is disposed to define an acute angle of, respectively, about 15–30° and 30–60° with longitudinal axis 92 directing, as is shown at 91, the angular deflection of bearing portions 90 toward frame member 42. In this regard, for the embodiment of spacer gasket 40 shown in FIG. 3 wherein elastomeric member 48 is retained on the inner peripheral edge surface 44 of frame 42, the cooperation of the camming surfaces advantageously directs the deflection of the bearing portions away from the interior of the enclosure wherein the gasket might otherwise interfere with the proper operation of the circuit boards of the device.

In a most preferred embodiment, elastomeric member 48 is provided to be generally symmetrical about frame second axis 61, with the distal ends 96 of each bearing portion 90 including an inboard surface, 104*a–b*, which extends below the corresponding frame face surface 62 radially to peripheral edge surface 64 to define an associated groove portion, 106*a–b*. Each of groove portions 106 separates the corresponding bearing portion 90 radially from frame 42 and, as is shown at 91, thereby accommodates the deflection of the bearing portions into the frame. It is preferred for added strength and for more surface area at the attachment interface, that each of groove portions 106 is filleted as is shown at 108*a–b*.

Further regarding the preferred embodiment of FIG. 4, frame peripheral edge surface 64*a* on which the inboard side 80 of elastomeric member 42 is retained is configured to include upper and lower axial surfaces, 110*a–b*, and associated upper and lower radial surfaces, 112*a–b*, which together define lands, 113*a–b*, for supporting the proximal end 94 of a corresponding one of bearing portions 90. Moreover, each of the radial surfaces 112 preferably is disposed to define an obtuse angle, referenced at "β" for surface 112*a*, with the corresponding axial surface 110. In contrast to the alternative, orthogonally-stepped configuration shown in phantom at 114, the preferred angular disposition of surfaces 112 increases the localized thickness of the elastomeric member resulting in a still further reduction of the closure force needed to compress the gasket.

Figure 4A:
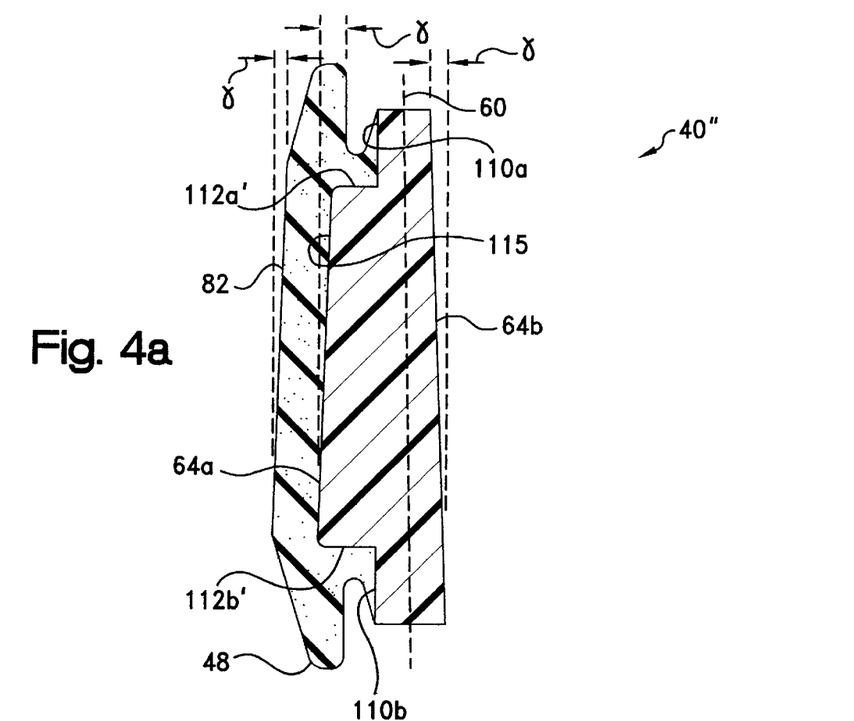
FIG. 4A is a cross-sectional view of an alternative embodiment of the spacer gasket of FIGS. 3 and 4.
Figure 5:
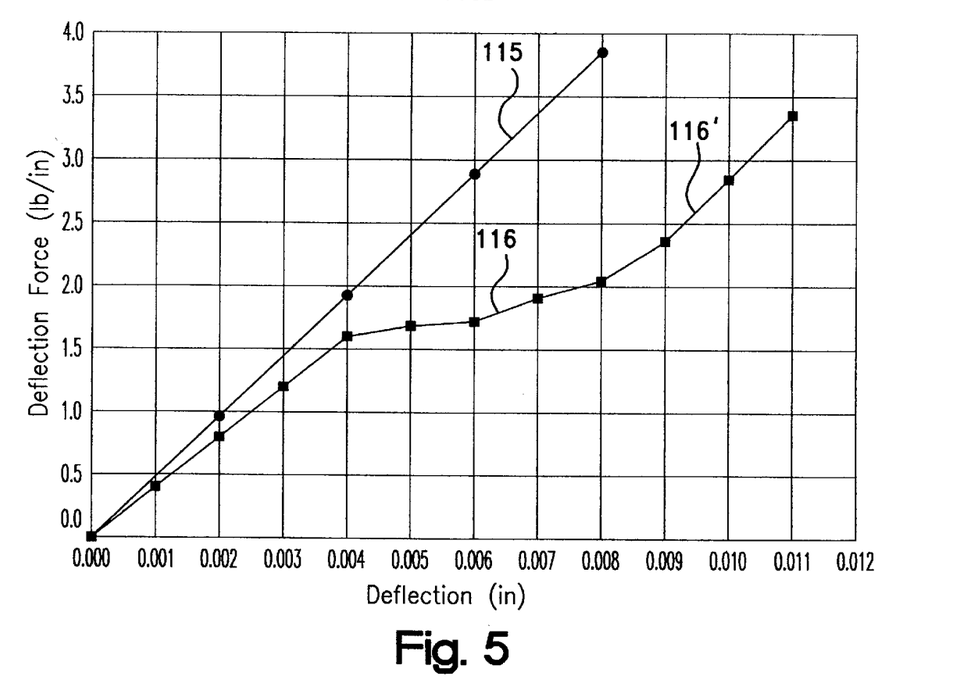
FIG. 5 is a plot comparing the respective force-deflection responses of the spacer gasket embodiments of FIGS. 4 and 4A.

Continuing with FIG. 4A, a cross-sectional view of an alternative embodiments of gasket 40 is shown generally at 40'. In this embodiment, an intermediate radial surface, 115, of inner peripheral edge surface 64*a* is defined as extending between radial surfaces 112*a'* and 112*b'*. In further accordance with the precepts of the present invention, intermediate radial surface 115 and, optionally, outer peripheral edge surface 64*b* each are tapered radially inwardly to define, relative to frame first central axis 60, an acute angle, commonly referenced at "γ," of typically from about 2°–5°. As a result, the outboard side 82 of elastomeric member 48 thereby is inwardly angled to likewise define an acute angle γ with the frame first said first central axis. By way of comparison, reference may be had to FIG. 5 wherein representative load-deflection curves are plotted at 115 and 115' as functions of total force and displacement for standardized lengths of, respectively, gasket embodiments 40 and 40'. In contrast to the load response of gasket 40 which is relatively linear, the load response of gasket 40' exhibits a "buckling" region, referenced at 116, wherein the compressive load force remains relatively constant with increasing gasket deflection. Advantageously, such buckling region contributes to a still further lowering of the closure force requirements of the gasket.

Figure 6:
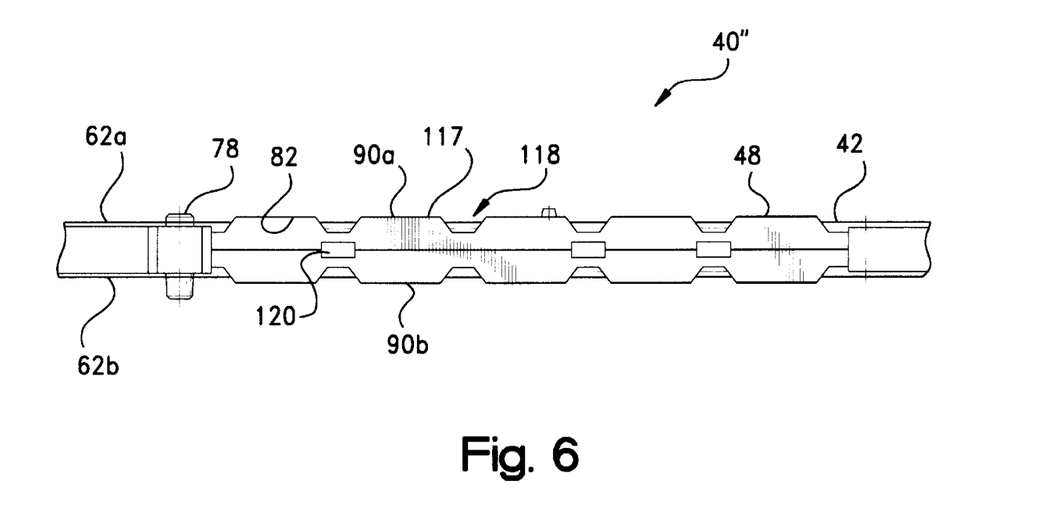
FIG. 6 is front elevational view of an interrupted EMI shielding spacer gasket in accordance with the present invention.

Turning to FIG. 6, a front elevational view of another embodiment of spacer gasket 40 of the present invention is shown at 40" wherein the bearing portions 90 of elastomeric member 48 are interrupted. That is, the outboard side 82 of the elastomeric member extends along the inner or outer perimeter 44 or 46 (FIG. 3) of frame 42 as a series of discrete bearing portion segments or "beads," one of which is referenced at 117. For certain applications dictating very low closure forces, such interruption of the elastomeric member advantageously effects an additional reduction in the closure force required for the compression of the gasket. The gaps, one of which is referenced at 118, so formed between segments 117 may be sized with respect to the wavelength of the EMI radiation to maintain the required level of EMI shielding. To improve the retention of the elastomeric member 48, frame 42 may be include a plurality of radial tabs, one of which is shown at 120, which extend through the elastomeric member.

Figure 7:
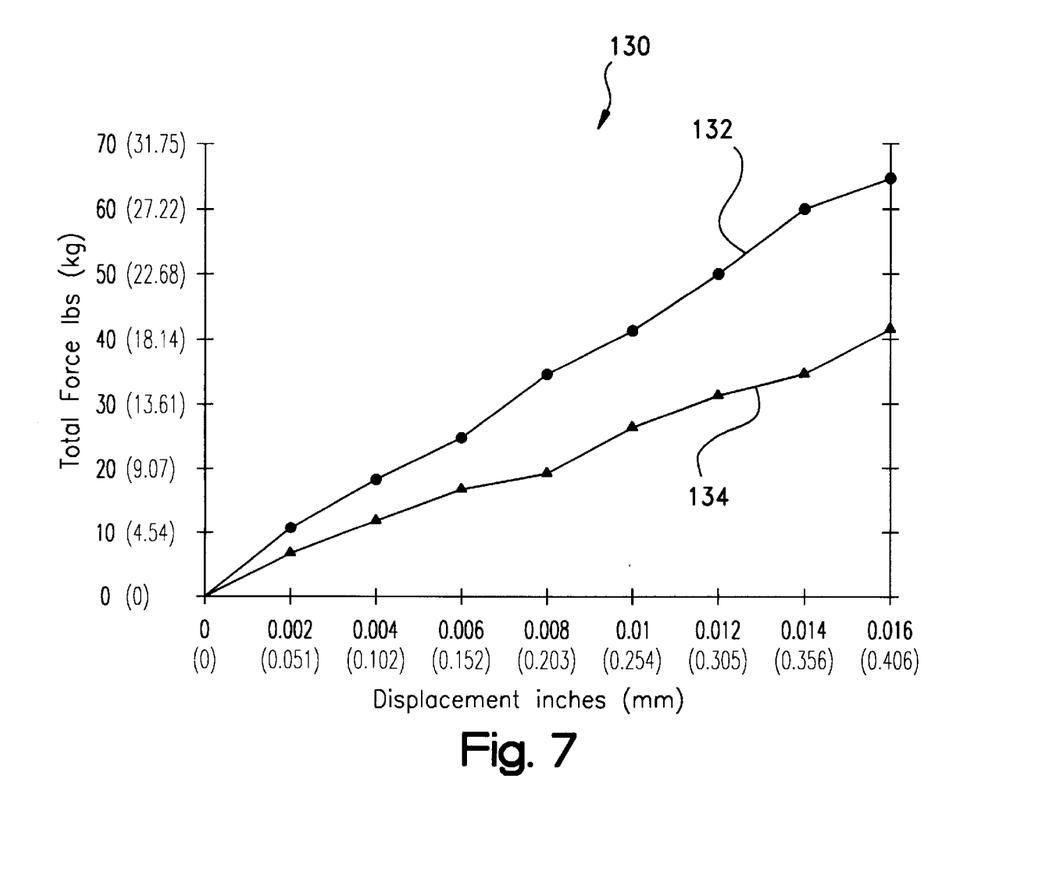
FIG. 7 is a plot comparing the force-displacement responses of a continuous spacer gasket and an interrupted spacer gasket as in FIG. 5.

The effects of a continuous and interrupted gasket configuration are compared graphically at 130 in FIG. 7 wherein load-deflection curves are plotted at 132 and 134 as functions of total force and displacement for, respectively, standardized 12 inch (30.5 cm) lengths of a continuous and an interrupted gasket design. It may be seen that within a given application, the force required to deflect an interrupted conductive elastomeric member is lower than for a comparable continuous design.

Figure 8:
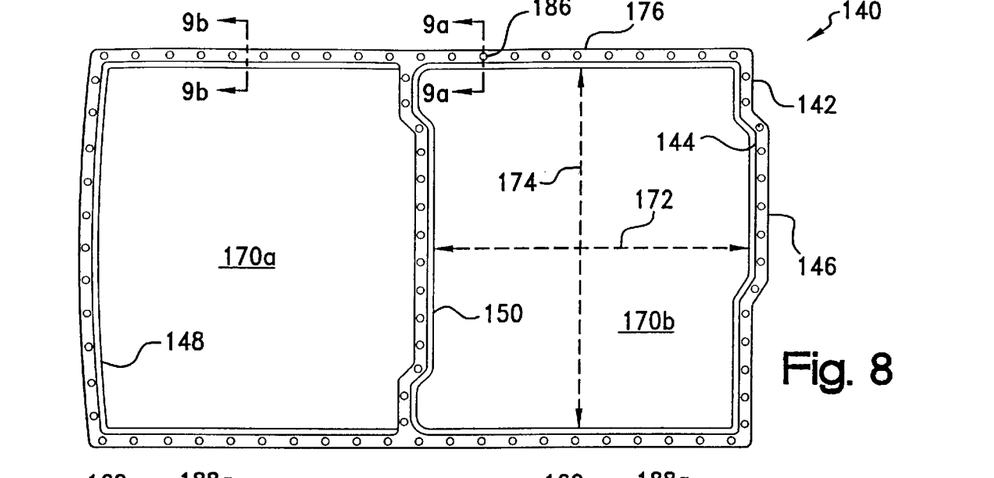
FIG. 8 is a top view of another embodiment of another EMI shielding spacer gasket in accordance with the present invention.

Referring next to FIG. 8, yet another embodiment of a spacer gasket assembly according to the present invention is shown at 140. As before, in basic construction, assembly 140 includes a frame, 142, having an inner and outer perimeter, 144 and 146, and an electrically conductive, elastomeric member, 148, which extends along at least a portion of one or both the inner perimeter 144 or outer perimeter 146 of the frame. Preferably, frame 142, which may include one or more integral mullions or dividers, 150, again is conventionally injection or otherwise molded of an electrically-nonconductive, thermoplastic or other polymeric material.

Figure 9A:
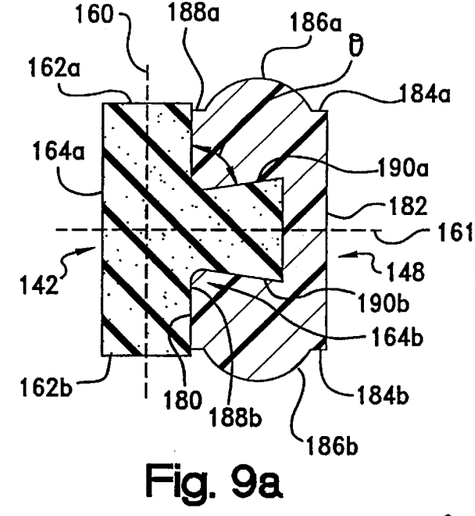
FIG. 9A is a cross-sectional view of the spacer gasket of FIG. 8 taken through line 9A—9A of FIG. 8.
Figure 9B:
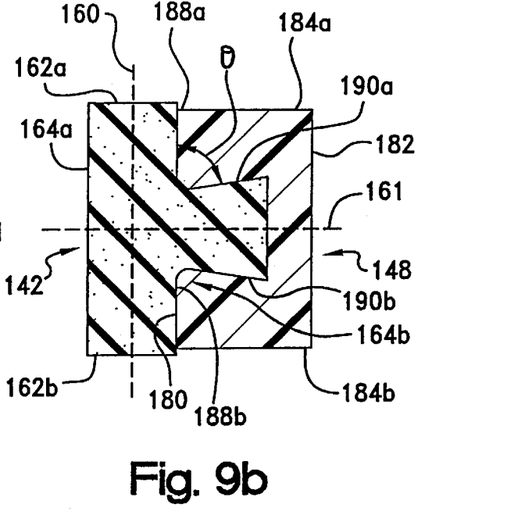
FIG. 9B is a cross-sectional view of the spacer gasket of FIG. 8 taken through line 9B—9B of FIG. 8.

As may be seen with additional reference to the enlarged cross-sectional views of FIGS. 9A and 9B, frame 142 is provided as having a cross-sectional profile of a closed geometric area which extends along an axially-directed first central axis, 160, and along a radially-directed second central axis, 161. Such profile is bounded by an upper, 162a, lower, referenced generally at 162b, face surface, and by an inner and outer peripheral edge surface, 164a–b, which define the inner and outer perimeters 144 and 146 (FIG. 8) of frame 42. Within an enclosure such as enclosure 12 of FIG. 1, assembly 140 is oriented such that first axis 160 is disposed generally perpendicular to the surfaces to be gasketed, such as opposing surfaces 66a–b of boards 14a–b which are juxtaposed in phantom in FIG. 4, with second axis 161 being disposed generally parallel to those surfaces. Further within enclosure 12, each of the frame face surfaces 162 is disposed in confronting opposition with a corresponding one of the surfaces 66 of the enclosure.

Returning to FIG. 8, it may be seen that as extending along its inner and outer perimeter 144 and 146, frame 42 defines within the electronics enclosure one or more enclosed regions, such as regions 170a–b, each having, as is referenced for region 170b, a lengthwise extent, 172, and a widthwise extent, 174. As is shown at 176 for region 170b, at least a portion of the inner or outer margins of enclosed regions 170 is defined by elastomeric member 148.

Looking again to FIGS. 9A–B, elastomeric member 148 is shown as having an inboard side, 180, which is molded over or otherwise retained on a corresponding peripheral edge surface 164 of frame 142, an outboard side, 182, and top and bottom surfaces, 184a–b, which are compressible axially under a predetermined compressive load intermediate surfaces 66 of enclosure 12 (FIG. 1) for providing an electrically conductive pathway therebetween. In this regard, elastomeric member 148 preferably is overmolded to cover edge surface 164b by injection or compression as formed of an electrically-conductive, elastomeric composition.

In the uncompressed orientation shown in FIGS. 8 and 9, it may be seen that the top and bottom surfaces 184 of elastomeric member 148 are molded to include a plurality of integrally-formed projections, one of which is referenced at 186a, disposed intermediate inboard and outboard sides 180 and 182 as spaced apart along at least a portion of the perimeter of frame member 142. As may be seen best in FIG. 9A, the projections 186 extend beyond a corresponding one of the frame face surfaces 162 for contact with a corresponding one of the surfaces 166 of the enclosure. Each of projections 186 typically will extend about ⅛-inch (0.5 mm) or more beyond the corresponding surface 166, and, as is shown for projections 186a and 186b, preferably is aligned axially in registration with a corresponding projection 186 on the opposing surface 184. Although projections 186 are shown in FIGS. 8 and 9 to be of a generally preferred hemispherical geometry, other shapes therefor, including polygonal, elliptical, and the like, may be envisioned and therefore are to be considered within the scope of the invention herein involved.

As before, frame peripheral edge surface 164b on which the inboard side 180 of elastomeric member 142 is retained is configured to include upper and lower axial surfaces, 188a–b, and associated upper and lower radial surfaces, 190a–b, which intersect to define corresponding lands for supporting the inboard side 180 of elastomeric member 148. Moreover, each of the radial surfaces 190 preferably is disposed to define an acute angle, referenced at "φ" for surface 190a, the corresponding axial surface 188. In contrast to an alternative, orthogonally-stepped configuration, the preferred angular disposition of surfaces 190 functions to better retain elastomeric member 148 on frame 142. In an alternative embodiment of gasket assembly 140 which is shown generally at 140' in FIG. 10 with equivalent elements being referenced with prime designations, frame peripheral edge surface 164b' on which the inboard side 180' of elastomeric member 142' is retained is provided to have the generally oblong or "tongue-in-groove" configuration shown at 189. As also array be seen in FIG. 10 at 186', it is preferred that the projections 186 are formed as having a splined or "fluted" surface geometry to promote a more uniform deformation while under a compressive load.

Figure 10:
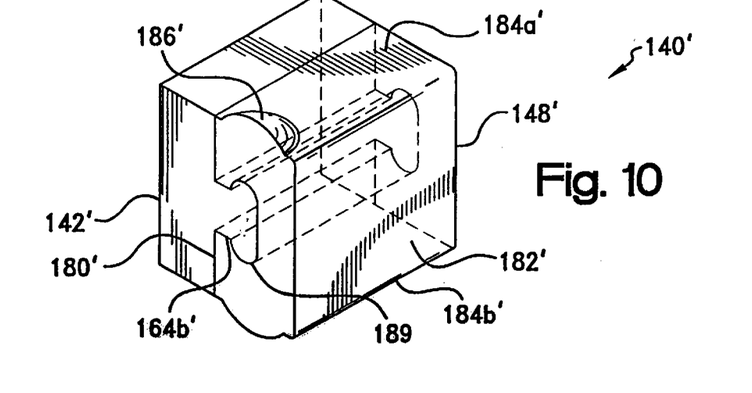
FIG. 10 is a cross-sectional, perspective end view of an alternative embodiment of the spacer gasket of FIG. 8.
Figure 11:
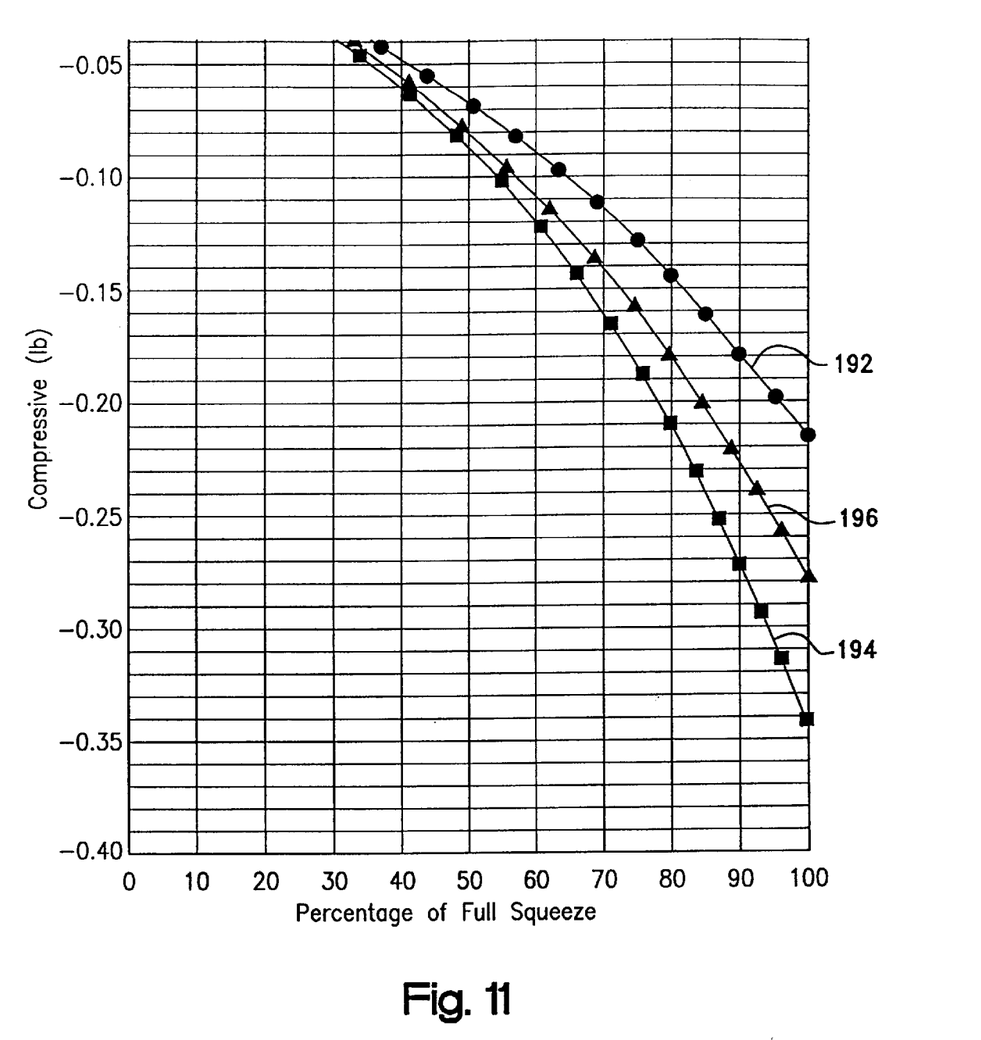
FIG. 11 is a plot showing the predicted force-deflection response of the spacer gasket embodiment of FIG. 10.

The finite element analysis (FEA) predicted load-deflection response of gasket 140' of FIG. 10 is graphically illustrated at 191 in FIG. 11. In FIG. 11, the percentage of the "full squeeze" deflection of the gasket is plotted as a function of compressive load for a lower limit FEA estimation, referenced at 192, an upper limit FEA estimation, referenced at 194, and an average FEA estimation, referenced at 196. From graph 190, it is confirmed that gasket 140' is suitable for low closure force applications in being deflectable under a minimal compressive loading.

The Example to follow is illustrative of the practicing and unique features of the invention herein involved, but should not be construed in any limiting sense.

EXAMPLE

To confirm the precepts of the present invention, the static load-deflection responses of two spacer gasket profiles configured in accordance with the invention, and that of a conventionally flat profile representative were predicted using a nonlinear finite element modeling program, MARC K6 (MARC Analysis Research Corp., Palo Alto, Calif.). In this regard, the elastomeric member cross-sections shown in compression at 200 in FIG. 12A as representative of the prior art, and at 300 and 400, respectively, in FIGS. 12B and 12C as representative of the present invention, were modeled using four-node plane strain Hermann elements, as are represented by the grid lines commonly referenced at 500.

The compression of the members was simulated using a contact element which is shown as the flat mating surface commonly referenced prior to compression at line 502, and after compression at line 503. The plastic frame (not shown) was considered in the analysis as a rigid body relative to the elastomeric member. The corresponding uncompressed profiles are shown respectively in phantom at 201, 301, and 401. Profile 401 of the particularly preferred embodiment of FIG. 12C may be seen to differ from profile 301 of the embodiment of FIG. 12B in including the acutely-angled camming surface referenced at 402. As was detailed hereinbefore, surface 402 effects the inboard deflection of the gasket bearing portion toward the frame 404. Such deflection may be contrasted with the outboard deflection of the gasket bearing portion shown in FIG. 12B. Profile 401 further differs from profile 301 as shown to be retained on a frame peripheral edge surface which includes an acutely angled radial surface, 404.

Based upon the above models, the load-deflection responses of the gasket profiles were predicted by finite element analysis using the Mooney-Rivlin strain energy function, $$W = c_1(I_1-1) + c_2(I_2-1) \tag{1}$$

where $C_1$, $C_2$, are material constants, and $I_1$, $I_2$ are strain invariants. Equation 1 is a special case of the Ogden model, $$W = \sum_{i=1}^{m} \frac{\mu_i}{\alpha_i}(\lambda_1^{\alpha_i} + \lambda_2^{\alpha_i} + \lambda_2^{\alpha_i} - 3) \tag{2}$$

where $\lambda_1$, $\lambda_2$, $\lambda_3$ are the stretch ratios and $\alpha_i$, $\mu_i$ are the material coefficients. For a two-term Odgen model, i.e., m=2, Eqs. 1 and 2 are equivalent. Table 2 summarizes the two-term Odgen Coefficients and the bulk modulus, which was used to account for the near incompressibility of elastomeric materials, of a representative silicone-based, silver-plated-glass filled elastomeric molding material (Cho-Seal® 1310, Parker Chomerics Division, Woburn, Mass.).

TABLE 2

Representative Ogden Model
Material (Coefficients) (Cho-Seal ® 1310)

| | |
|---|---|
| Bulk Modulus | K = 200,000 psi |
| Ogden Coefficients | $\mu_1$ = −173 psi |
| | $\mu_1$ = −522 psi |
| | $\alpha_1$ = 2 |
| | $\alpha_2$ = −2 |

Figure 12A:
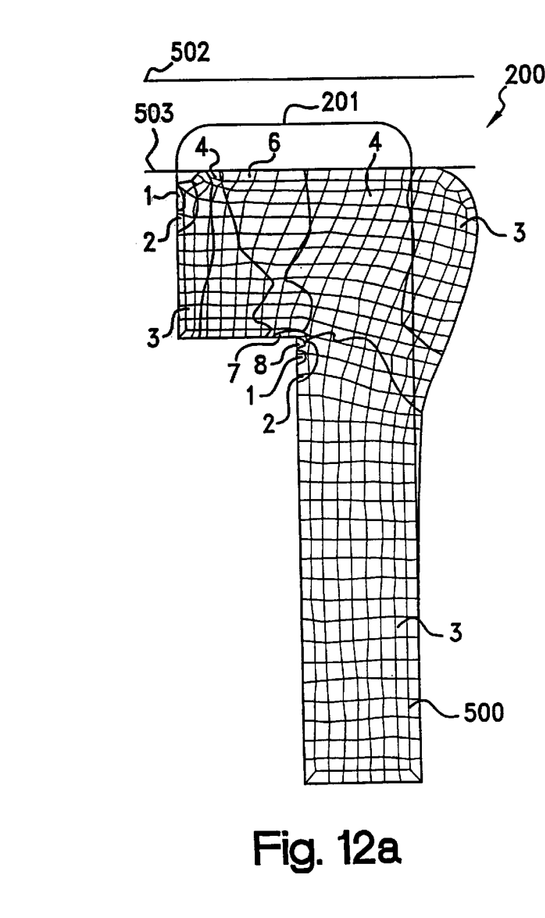
FIG. 12A is a graphical representation of a finite element model of the vertical stress distributions in a cross-section of a compressed spacer gasket profile representative of the prior art.
Figure 12B:
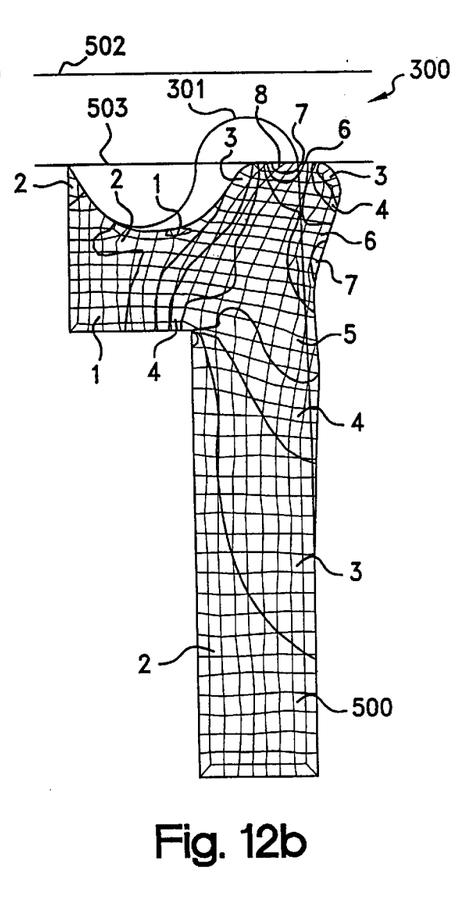
FIG. 12B is a graphical representation of a finite element model of the vertical stress distributions in a cross-section of a compressed spacer gasket profile representative of the present invention.
Figure 12C:
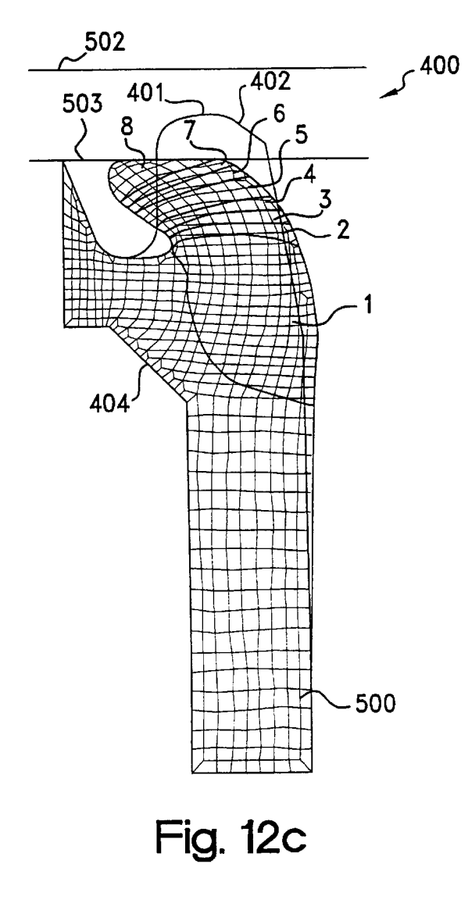
FIG. 12C is a graphical representation of a finite element model of the vertical stress distributions in a cross-section of another compressed spacer gasket profile representative of the present invention.
Figure 13:
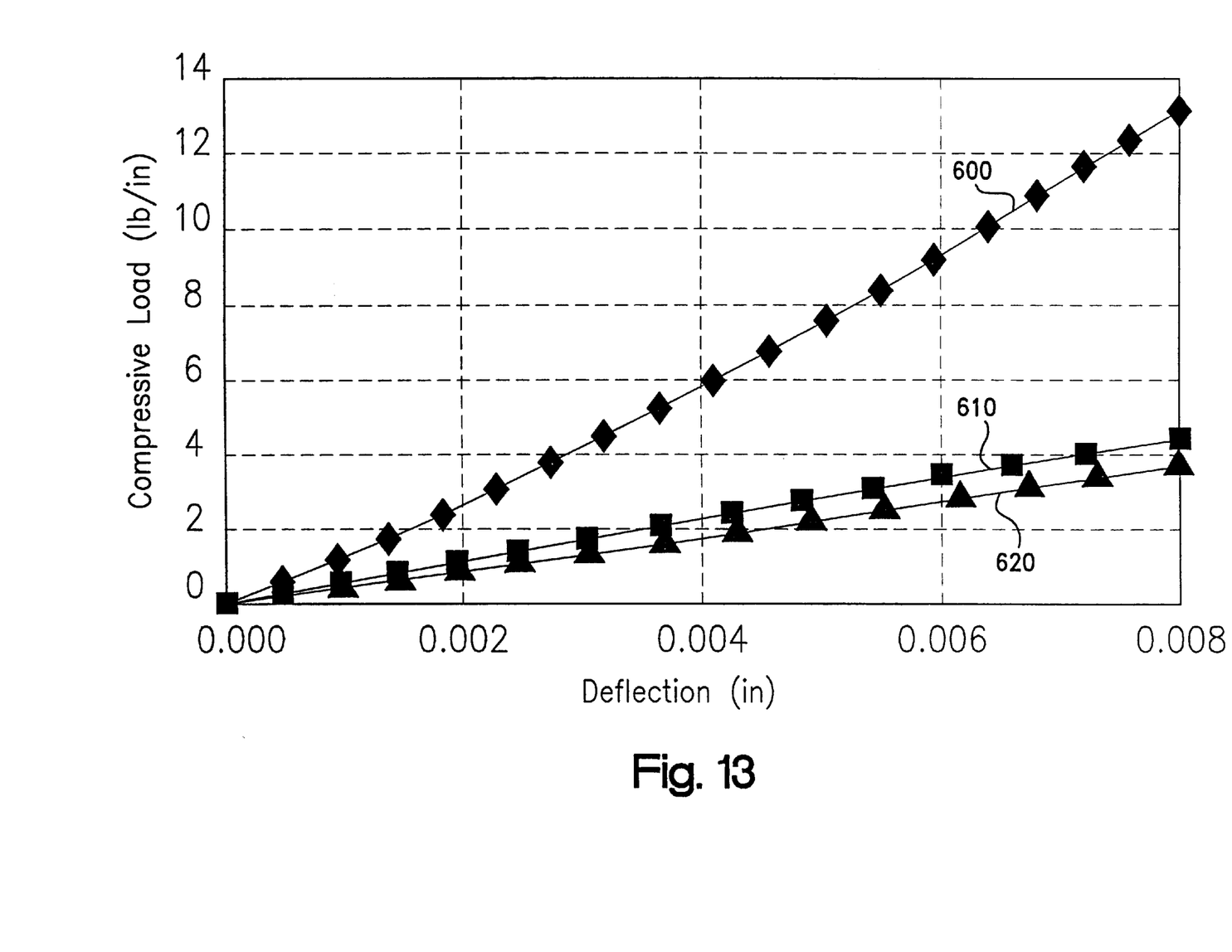
FIG. 13 is a comparative plot of predicted load-deflection response curves for the gasket profiles of FIG. 12A–C.

In the finite element models of FIGS. 12A–C, the predicted stress distributions in the vertical direction are shown by the contours designated 1–8 representing, respectively, regions of increasing stress. The bending mechanism responses of the profiles of the present invention may be seen clearly in FIGS. 12B and 12C. As may be appreciated through additional reference to FIG. 13, wherein the finite element analysis predicted compressive load-deflection curves for the profiles of FIG. 12A, 12B, and 12C are plotted, respectively, at 600, 610, and 620, such mechanism appreciably reduces the closure force required to deflect the gasket. Of course, based on the foregoing simulations, gasket geometries other that those shown in FIGS. 12B and 12C now may be envisioned which incorporate this bending mechanism feature. These other geometries therefore are to be considered to be within the scope of the present invention.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. An EMI shielding spacer gasket assembly for interposing under a predetermined compressive load within an electronics enclosure between a first surface and an oppositely-disposed second surface of the enclosure, said assembly comprising:

a frame member having an inner and an outer perimeter and a cross-sectional profile of a closed geometric area which extends along an axially-directed first central axis disposable generally perpendicular to the surfaces of the enclosure and along a radially-directed second central axis disposable generally parallel to the surfaces of the enclosure, and which is bounded by an upper and a lower face surface each disposable in opposition with a corresponding one of the first or second surfaces of the electronic enclosure, and by an inner and outer peripheral edge surface which define, respectively, the inner and outer perimeter of said frame member; and an electrically conductive, elastomeric member extending along at least a portion of one or both the inner or outer perimeter of said flame member, said elastomeric member having an inboard side which is retained on a corresponding peripheral edge surface of said frame member and an outboard side which is axially compressible under said compressive load intermediate the surfaces of the enclosure for providing an electrically conductive pathway therebetween, said outboard side of said elastomeric member exhibiting in an uncompressed orientation elongate upper and lower bearing portions each extending in cross-section along a common longitudinal axis from an internal proximal end to an external distal end terminating beyond a corresponding one of said face surfaces of the frame member for contact with a corresponding one of the surfaces of the enclosure, said longitudinal axis being disposed a spaced-apart radial distance from the first central axis of said frame member, whereby said distal end of each of said bearing portions is angularly deflectable responsive to said compressive load.

2. The spacer gasket assembly of claim 1 wherein said frame member extends to define one or more enclosed regions within said electronics enclosure, and wherein said elastomeric member defines at least a portion of the inner or outer margin of at least one of said enclosed regions.

3. The spacer gasket assembly of claim 2 wherein said elastomeric member is generally symmetrical about the axial extent of said frame member.

4. The spacer gasket assembly of claim 1 wherein said elastomeric member is formed of a composition which comprises a silicone binder and an electrically-conductive filler.

5. The spacer gasket assembly of claim 1 wherein said distal end of at least one of said bearing portions of said outboard side of said elastomeric member includes at least one outboard camming surface disposed to define an acute angle with said longitudinal axis, said camming surface developing a force component responsive to said compressive load directing the angular deflection of said one of said bearing portions towards said frame member.

6. The spacer gasket assembly of claim 5 wherein said inboard side of said elastomeric member is retained on said inner peripheral edge surface of said frame member.

7. The spacer gasket assembly of claim 1 wherein said peripheral edge surface on which said inboard side of said elastomeric member is retained on said frame member includes upper and lower radial surfaces and upper and lower axial surfaces, each of said radial surfaces defining a land with an associated one of said axial surfaces for supporting the proximal end of a corresponding one of said bearing portions of said elastormeric member.

8. The spacer gasket assembly of claim 7 wherein said peripheral edge surface on which said inboard side of said elastomeric member is retained on said frame member further includes an intermediate radial surface extending between said upper and lower axial surfaces, said intermediate radial surface being tapered radially inwardly to define an acute angle with said first central axis.

9. The spacer gasket assembly of claim 8 wherein the other said peripheral edge is tapered radially inwardly to define an acute angle with said first central axis.

10. The spacer gasket assembly of claim 7 wherein each of said upper and lower radial surfaces is disposed to define an obtuse angle with said associated one of said upper and lower axial surfaces.

11. The spacer gasket assembly of claim 1 wherein said bearing portions of said elastomeric member are interrupted such that said outboard side of said elastomeric member extends along the perimeter of said frame member as a series of discrete bearing portion segments.

12. The spacer gasket assembly of claim 1 wherein said distal end of at least one of said bearing portions of said elastomeric member includes an inboard surface which extends below the corresponding face surface of said frame member radially to said peripheral edge surface of said frame member to define a groove portion separating said one of said bearing portions from said frame member.

13. Within an electronics enclosure, an EMI shielded assembly comprising a first surface of the enclosure, an oppositely-disposed second surface of the enclosure, and a spacer gasket interposed under a predetermined compressive load between said first and said second surface of said enclosure, said spacer gasket comprising:

a frame member having an inner and an outer perimeter and a cross-sectional profile of a closed geometric area which extends along an axially-directed first central axis disposed generally perpendicular to the surfaces of the enclosure and along a radially-directed second central axis disposed generally parallel to the surfaces of the enclosure, and which is bounded by an upper and a lower face surface each disposed in opposition with a corresponding one of the first or second surfaces of the electronic enclosure, and by an inner and outer peripheral edge surface which define, respectively, the inner and outer perimeter of said frame member; and an electrically conductive, elastomeric member extending along at least a portion of one or both the inner or outer perimeter of said frame member, said elastomeric member having an inboard side which is retained on a corresponding peripheral edge surface of said frame member and an outboard side which is compressed axially under said compressive load intermediate said surfaces of the enclosure effective to provide an electrically conductive pathway therebetween, said outboard side of said elastomeric member exhibiting in an uncompressed orientation elongate upper and lower bearing portions each extending in cross-section along a common longitudinal axis from an internal proximal end to an external distal end terminating beyond a corresponding one of said face surfaces of the frame member in contact with a corresponding one of the surfaces of the enclosure, said longitudinal axis being disposed a spaced-apart radial distance from the first central axis of said frame member, whereby said distal end of each of said bearing portions is angularly deflected responsive to said compression of said elastomeric member intermediate said surfaces of the enclosure under said compressive load.

14. The EMI shielded assembly of claim 13 wherein said frame member of said spacer gasket extends to define one or more enclosed regions within said electronics enclosure, and wherein said elastomeric member defines at least a portion of the inner or outer margin of at least one of said enclosed regions.

15. The EMI shielded assembly of claim 14 wherein said elastomeric member of said spacer gasket is generally symmetrical about the axial extent of said frame member.

16. The EMI shielded assembly of claim 13 wherein said elastomeric member of said spacer gasket is formed of a composition which comprises a silicone binder and an electrically-conductive filler.

17. The EMI shielded assembly of claim 13 wherein said distal end of at least one of said bearing portions of said outboard side of said spacer gasket elastomeric member includes at least one outboard camming surface disposed to define an acute angle with said longitudinal axis, said camming surface developing a force component responsive to said compressive load directing the angular deflection of said one of said bearing portions towards said frame member.

18. The EMI shielded assembly of claim 17 wherein said inboard side of said elastomeric member is retained on said inner peripheral edge surface of said frame member.

19. The EMI shielded assembly of claim 13 wherein said peripheral edge surface on which said inboard side of said elastomeric member is retained on said spacer gasket frame member includes upper and lower radial surfaces and upper and lower axial surfaces, each of said radial surfaces defining a land with an associated one of said axial surfaces for supporting the proximal end of a corresponding one of said bearing portions of said elastomeric member.

20. The EMI shielded assembly of claim 19 wherein each of said upper and lower radial surfaces is disposed to define an obtuse angle with said associated one of said upper and lower axial surfaces.

21. The EMI shielded assembly of claim 19 wherein said peripheral edge surface on which said inboard side of said elastomeric member is retained on said frame member further includes an intermediate radial surface extending between said upper and lower axial surfaces, said intermediate radial surface being tapered radially inwardly to define an acute angle with said first central axis.

22. The EMI shielded assembly of claim 21 wherein the other said peripheral edge is tapered radially inwardly to define an acute angle with said first central axis.

23. The EMI shielded assembly of claim 13 wherein said bearing portions of said elastomeric member of said spacer gasket are interrupted such that said outboard side of said elastomeric member extends along the perimeter of said frame member as a series of discrete bearing portion segments.

24. The EMI shielded assembly of claim 13 wherein said distal end of at least one of said bearing portions of said spacer gasket elastomeric member includes an inboard surface which extends below the corresponding face surface of said frame member radially to said peripheral edge surface of said frame member to define a groove portion separating said one of said bearing portions from said frame member.

25. An EMI shielding spacer gasket assembly for interposing under a predetermined compressive load within an electronics enclosure between a first surface and an oppositely-disposed second surface of the enclosure, said assembly comprising:

a frame member having an inner and an outer perimeter and a cross-sectional profile of a closed geometric area which extends along an axially-directed first central axis disposable generally perpendicular to the surfaces of the enclosure and along a radially-directed second central axis disposable generally parallel to the surfaces of the enclosure, and which is bounded by an upper and a lower face surface each disposable in opposition with a corresponding one of the first or second surfaces of the electronic enclosure, and by an inner and outer peripheral edge surface which define, respectively, the inner and outer perimeter of said frame member; and an electrically conductive, elastomeric member extending along at least a portion of one or both the inner or outer perimeter of said frame member, said elastomeric member having an inboard side which is retained on a corresponding peripheral edge surface of said frame member and an outboard side, and a top and bottom surface, at least one of said top or said bottom surface being formed to include a plurality of projections disposed intermediate said inboard and outboard side as spaced-apart along at least a portion of said frame member, each of said projections extending beyond the corresponding upper or lower surface of said frame member for contact with a corresponding one of the surfaces of the enclosure, whereby each of said projections is axially compressible under said compressive load intermediate the surfaces of the enclosure for providing an electrically conductive pathway therebetween.

26. The spacer gasket assembly of claim 25 wherein said fame member extends to define one or more enclosed regions within said electronics enclosure, and wherein said elastomeric member defines at least a portion of the inner or outer margin of at least one of said enclosed regions.

27. The spacer gasket assembly of claim 25 wherein the other of said top or said bottom surface of said elastomeric member is formed to include a plurality of said projections.

28. The spacer gasket assembly of claim 27 wherein said each of said projections of said top or said bottom surface is aligned axially in registration with a corresponding said projection of the other of said top or bottom surface.

29. The spacer gasket assembly of claim 25 wherein said elastomeric member is formed of a composition which comprises a silicone binder and an electrically-conductive filler.

30. The spacer gasket assembly of claim 25 wherein said inboard side of said elastomeric member is retained on said inner peripheral edge surface of said frame member.

31. The spacer gasket assembly of claim 25 wherein said peripheral edge surface on which said inboard side of said elastomeric member is retained on said frame member includes upper and lower radial surfaces and upper and lower axial surfaces, each of said radial surfaces defining a land with an associated one of said axial surfaces for supporting the inboard side of said elastomeric member.

32. The spacer gasket assembly of claim 31 wherein each of said upper and lower radial surfaces is disposed to define an acute angle with said associated one of said upper and lower axial surfaces.

33. The spacer gasket assembly of claim 25 wherein each of said projections is generally hemispherically-shaped.

34. A low closure force EMI shielding gasket for interposition under a predetermined compressive load within an electronics enclosure between a first surface and an oppositely-disposed second surface of the enclosure, said gasket comprising:

an electrically-conductive elastomeric member having upper and lower bearing surfaces, at least one of said bearing surfaces being formed as a first series of discrete segments, each of said segments being spaced-apart radially from an adjacent one of said segments by a gap and extending axially for contact with a corresponding one of the surfaces of the enclosure, whereby each of said segments is axially compressible under said compressive load intermediate the surfaces of the enclosure for providing an electrically conductive pathway therebetween.

35. The gasket of claim 34 wherein the other of said bearing surfaces of said elastomeric member is formed as a second series of said discrete segments.

36. The gasket of claim 35 wherein said each of said first and said second series of said segments is aligned axially in registration with a corresponding one of said segments of the other of said series.

37. The gasket of claim 34 wherein said elastomeric member is formed of a composition which comprises a silicone binder and an electrically-conductive filler.

38. The gasket of claim 34 wherein said elastomeric member further has a top and a bottom surface, and wherein said bearing portion segments each are formed within a corresponding one of said top and bottom surfaces as an axially-extending projection.

39. The gasket of claim 38 wherein each said projection is generally hemispherically-shaped.

* * * * *